United States Patent
Lu et al.

(10) Patent No.: US 12,108,643 B2
(45) Date of Patent: *Oct. 1, 2024

(54) ORGANIC LIGHT-EMITTING DIODE DISPLAY SUBSTRATE, DISPLAY PANEL AND DISPLAY DEVICE HAVING AN ANODE LAYER COMPRISES A COMMON POWER LINE PROVIDED WITH VENT HOLES

(71) Applicant: BOE Technology Group Co., Ltd., Beijing (CN)

(72) Inventors: Jiangnan Lu, Beijing (CN); Guangliang Shang, Beijing (CN); Can Zheng, Beijing (CN); Yu Feng, Beijing (CN); Libin Liu, Beijing (CN); Jie Zhang, Beijing (CN); Mei Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/953,941

(22) Filed: Sep. 27, 2022

(65) Prior Publication Data

US 2023/0021618 A1 Jan. 26, 2023

Related U.S. Application Data

(63) Continuation of application No. 17/427,076, filed as application No. PCT/CN2020/128744 on Nov. 13, 2020, now Pat. No. 11,963,407.

(30) Foreign Application Priority Data

Nov. 28, 2019 (CN) .......................... 201911189833.6

(51) Int. Cl.
H10K 59/131 (2023.01)
G09G 3/3208 (2016.01)
H10K 59/121 (2023.01)

(52) U.S. Cl.
CPC ......... H10K 59/131 (2023.02); H10K 59/121 (2023.02); *G09G 3/3208* (2013.01);
(Continued)

(58) Field of Classification Search
CPC .... H10K 59/131; H10K 59/121; H10K 59/12; G09G 2320/0109; G09G 2320/0233;
(Continued)

(56) References Cited

U.S. PATENT DOCUMENTS 9,099,038 B2 * 8/2015 Omoto ................ G09G 3/3233
10,559,260 B2 * 2/2020 Ni ........................ H10K 59/121
(Continued)

FOREIGN PATENT DOCUMENTS

CN 101494014 A 7/2009
CN 107452772 A 12/2017
(Continued)

OTHER PUBLICATIONS

PCT/CN2020/128744 international search report.
CN201911189833.6 first office action.

*Primary Examiner* — Khiem D Nguyen
(74) *Attorney, Agent, or Firm* — IPro, PLLC

(57) ABSTRACT

Provided is a display substrate, the display substrate is provided with a display area and a peripheral area around the display area, and includes: a source/drain layer, a planarization layer and an anode layer which are laminated in
(Continued)

sequence, wherein in the peripheral area, the source/drain layer includes at least one pair of first signal lines including a signal line of a gate circuit and the anode layer includes a common power line provided with vent holes; and overlapping areas between two first signal lines in any pair of the first signal lines and a projection pattern of the vent hole are equal, the projection pattern of the vent hole being a pattern of an orthographic projection of the vent hole in the common power line onto the source/drain layer. A display panel and a display device are also provided.

20 Claims, 6 Drawing Sheets

(52) U.S. Cl.
CPC .............. *G09G 2320/0209* (2013.01); *G09G 2320/0233* (2013.01)

(58) Field of Classification Search
CPC ... G09G 2320/0426; G09G 2310/0281; G09G 2310/08; G09G 3/3208; G09G 2320/0209; G09G 2300/0426
See application file for complete search history.

(56) References Cited

U.S. PATENT DOCUMENTS

| | | | |
|---|---|---|---|
| 2005/0040441 | A1* | 2/2005 | Kimura .................. H10K 85/30 257/249 |
| 2009/0184946 | A1 | 7/2009 | Ahn et al. |
| 2012/0268002 | A1 | 10/2012 | Osako et al. |
| 2016/0211309 | A1 | 7/2016 | Seo et al. |
| 2017/0345883 | A1 | 11/2017 | Song et al. |
| 2018/0033830 | A1 | 2/2018 | Kim et al. |
| 2018/0061918 | A1 | 3/2018 | Park et al. |
| 2018/0275448 | A1* | 9/2018 | Hatsumi ........... G02F 1/134363 |
| 2018/0287093 | A1 | 10/2018 | Lee et al. |
| 2019/0394869 | A1* | 12/2019 | Kim ..................... H05K 1/0281 |
| 2020/0035773 | A1 | 1/2020 | Cheng |
| 2020/0264722 | A1 | 8/2020 | Lee et al. |
| 2022/0149138 | A1 | 5/2022 | Lu et al. |

FOREIGN PATENT DOCUMENTS

| | | |
|---|---|---|
| CN | 107665062 A | 2/2018 |
| CN | 107665911 A | 2/2018 |
| CN | 108695365 A | 10/2018 |
| CN | 109037282 A | 12/2018 |
| CN | 209199931 U | 8/2019 |
| CN | 110890407 A | 3/2020 |

* cited by examiner

ORGANIC LIGHT-EMITTING DIODE DISPLAY SUBSTRATE, DISPLAY PANEL AND DISPLAY DEVICE HAVING AN ANODE LAYER COMPRISES A COMMON POWER LINE PROVIDED WITH VENT HOLES

This application is a continuation application of U.S. application Ser. No. 17/427,076, filed on Jul. 29, 2021 issued as U.S. Pat. No. 11,963,407, and claims priority to the Chinese Patent Application No. 201911189833.6, filed on Nov. 28, 2019 and entitled "ORGANIC LIGHT-EMITTING DIODE DISPLAY SUBSTRATE, DISPLAY PANEL AND DISPLAY DEVICE", which are incorporated herein by reference in their entireties.

TECHNICAL FIELD

The present disclosure relates to a display substrate, a display panel and a display device.

BACKGROUND

In an organic light-emitting diode display panel, an anode layer is disposed on a planarization layer (PLN). Gases are generated during preparation of the PLN. In order to exhaust these gases smoothly, vent holes are formed in a common power (VSS) line disposed in a peripheral area of the anode layer.

SUMMARY

Embodiments of the present disclosure relate to a display substrate, a display panel and a display device.

At least one embodiment of the present disclosure provides a display substrate. The display substrate is provided with a display area and a peripheral area around the display area, and includes: a source/drain layer, a planarization layer and an anode layer which are laminated in sequence, wherein
  in the peripheral area, the source/drain layer includes at least a pair of first signal lines including a signal line of a gate circuit and the anode layer includes a common power line provided with vent holes; and
  overlapping areas between two first signal lines in any pair of the first signal lines and a projection pattern of the vent hole are equal, the projection pattern of the vent hole being a pattern of an orthographic projection of the vent hole in the common power line onto the source/drain layer.

In some embodiments, the vent holes in the common power line are arranged in a plurality of columns; and
  two first signal lines in any pair of the first signal lines are both overlapped with the projections of at least one column of vent holes in the projection patterns of the vent holes.

In some embodiments, two first signal lines in one pair of the first signal lines are both overlapped with the projections of the same column of vent holes in the projection patterns of the vent holes.

In some embodiments, overlapping areas between the two first signal lines and the projection of the same vent hole are equal.

In some embodiments, a shape of each vent hole in one column of vent holes is a centrally symmetrical, and a center of the projection of the vent hole is disposed in the middle between the two first signal lines.

In some embodiments, distances from the center of the projection of the vent hole to side edges of the two first signal lines in the one pair of the first signal lines are equal.

In some embodiments, a maximum size of the vent hole in a width direction of the first signal line is greater than a width of any one of the first signal lines.

In some embodiments, two first signal lines in one pair of the first signal lines are both overlapped with the projections of one column of vent holes in the projection patterns of the vent holes.

In some embodiments, two columns of vent holes whose projections are overlapped with the same pair of first signal lines are the same in quantity and area.

In some embodiments, the source/drain layer further includes at least one pair of second signal lines; and two second signal lines in any pair of the second signal lines are staggered from the projection patterns of the vent holes.

In some embodiments, the vent hole is square or circular.

In some embodiments, the source/drain layer includes a plurality of pairs of first signal lines; and overlapping areas between any two pairs of first signal lines and the projection patterns of the vent holes are equal or not equal.

In some embodiments, one pair of the first signal lines of the at least one pair of the first signal lines includes a high-level clock signal line and a low-level clock signal line.

In some embodiments, one pair of the first signal lines of the at least one pair of the first signal lines includes a high-level gate line and a low-level gate line.

At least one embodiment of the present disclosure provides a display panel. The display panel includes the display substrate as described in any of above embodiments.

At least one embodiment of the present disclosure provides a display device. The display apparatus includes the display panel as described in any of above embodiments.

DETAILED DESCRIPTION

For clearer descriptions of the objectives, technical solutions and advantages of the present disclosure, the embodiments of the present disclosure are described in detail hereinafter with reference to the accompanying drawings.

Organic light-emitting diodes (OLED) display panels are divided into passive matrix driving OLED (PMOLED) display panels and active matrix driving OLED (AMOLED)

display panels based on driving modes. The technical solutions provided in the present disclosure are mainly applied to AMOLED display panels.

Figure 1:
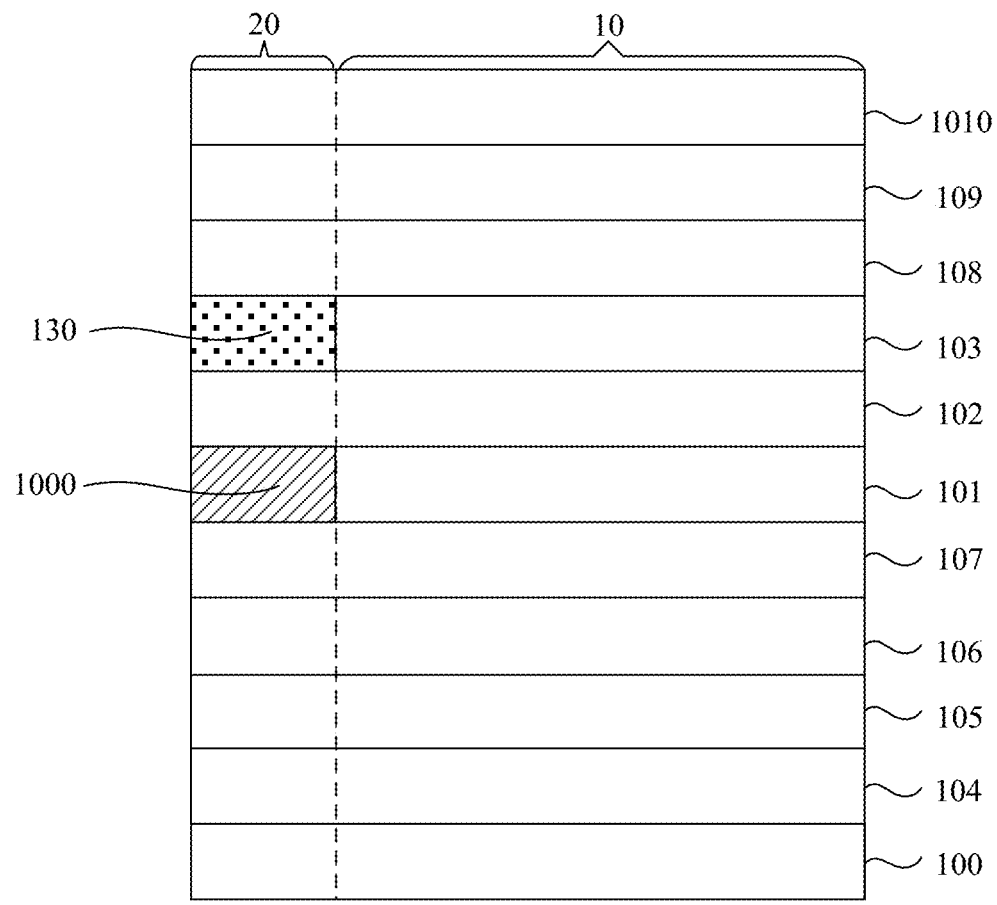
FIG. 1 is a hierarchical diagram of an OLED display substrate provided in some embodiments of the present disclosure.

FIG. 1 is a hierarchical diagram of an OLED display substrate provided in some embodiments of the present disclosure. Referring to FIG. 1, the OLED display substrate includes a substrate 100, and a first gate layer 104, a gate insulator (GI) layer 105, a second gate layer 106, an interlayer insulator layer 107, a source/drain (SD) layer 101, a planarization (PLN) layer 102, an anode layer 103, a pixel definition layer (PDL) 108, an organic light-emitting layer 109, and a cathode layer 1010 which are laminated on the substrate 100.

In some embodiments, the substrate 100 is a transparent substrate, such as a glass substrate. The gate insulator layer 105 and the interlayer insulator layer 107 are silicon nitride insulator layers, or other organic or inorganic insulator layers. The planarization layer 102 is a resin layer or other organic material layers. The first gate layers 104, the second gate layer 106, and the source/drain layer 101 each is a metal layer or an indium tin oxide thin film layer. The anode layer 103 is a metal layer. The cathode layer 1010 is an indium tin oxide thin film layer. The pixel definition layer 108 is a lyophobic material layer, such as a fluorine-containing polyimide layer or a fluorine-containing polymethyl methacrylate layer. The organic light-emitting layer 109 includes a hole transport layer, a light-emitting layer, an electron transport layer, and the like, which are laminated.

Figure 2:
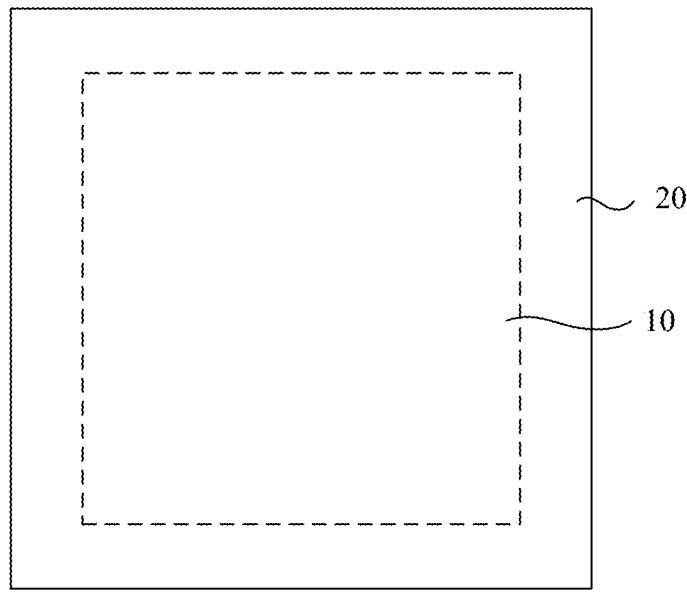
FIG. 2 is a schematic diagram of areas of an OLED display substrate provided in some embodiments of the present disclosure.

FIG. 2 is a schematic diagram of areas of an OLED display substrate provided in some embodiments of the present disclosure. Referring to FIG. 2, the OLED display panel has a display area 10 and a peripheral area 20 around the display area 10.

Referring to FIG. 1 again, in the peripheral area 20, a common power (VSS) line 130 is disposed in the anode layer 103, and signal lines 1000 configured to drive a circuit is disposed in the source/drain layer 101. For example, the signal lines 1000 disposed in the source/drain layer 101 generally include a signal line of a gate on array (GOA) circuit, clock signal lines arranged in pairs (a high-level clock signal line CK and a low-level clock signal line CB), and gate drive lines arranged in pairs (a high-level gate line VGH and a low-level gate line VGL).

Figure 3:
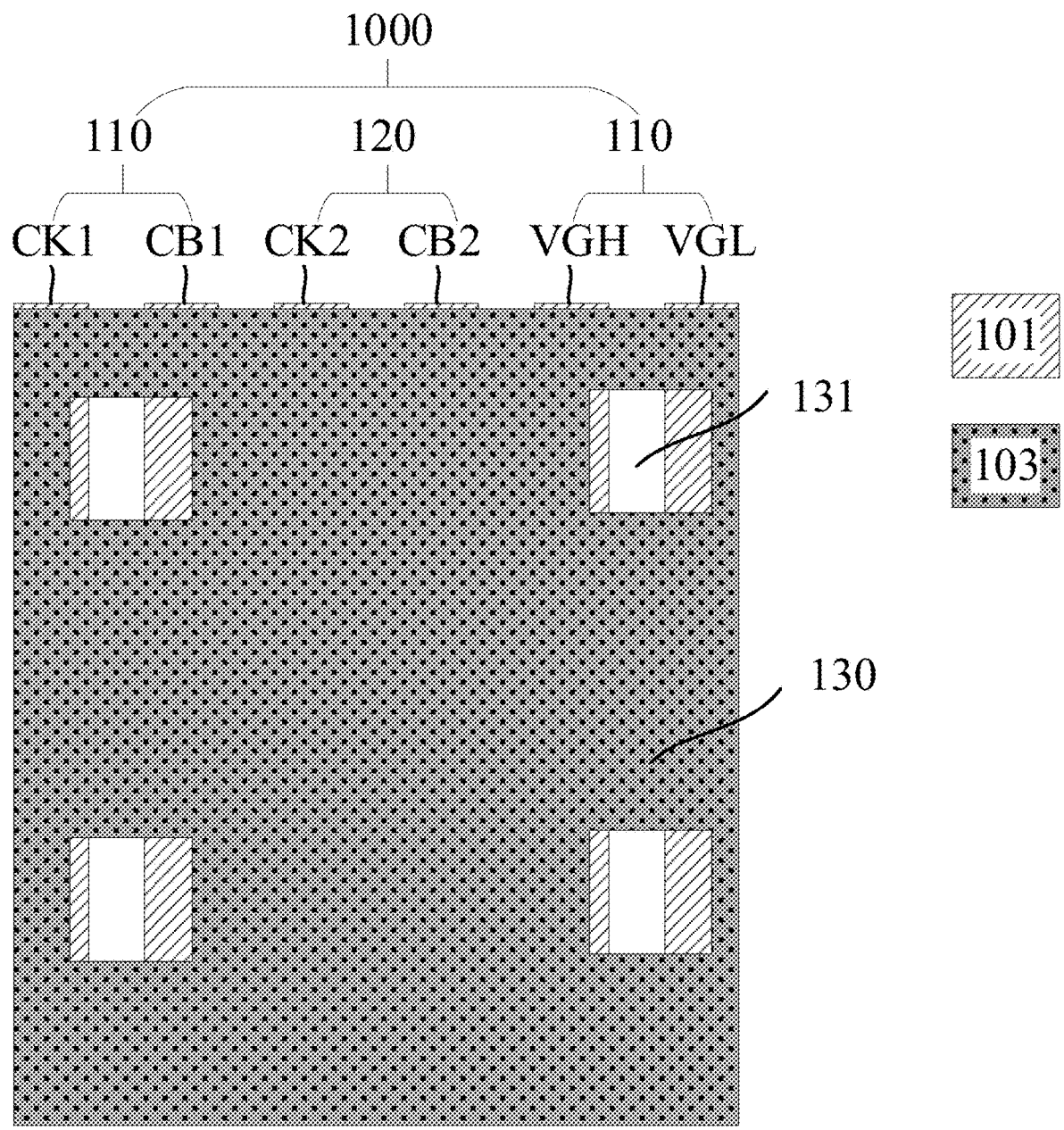
FIG. 3 is a schematic diagram of film layers in the related art.

Large parasitic capacitances exist in the VSS line of the anode layer and wiring of the source/drain layer. FIG. 3 is a schematic diagram of film layers in the related art. Referring to FIG. 3, the signal lines 1000 include first signal lines 110 and second signal lines 120. The first signal line 110 is a signal line which is overlapped with a projection of the vent hole 131, and the second signal line 120 is a signal line that is staggered (not overlapped) with the projection of the vent hole 131.

Overlapping areas between the vent hole 131 in the VSS line and two first signal lines in one pair of first signal lines 110 are not equal. For example, the overlapping area between the vent hole 131 and CK1 and the overlapping area between the vent hole 131 and CB1 are not equal. In this case, the overlapping areas between the VSS line 130 and two first signal lines 110 of one pair of first signal lines 110 are not equal, which causes different parasitic capacitances generated between the VSS line 130 and the two first signal lines 110. Different parasitic capacitances lead to mismatch between signals transmitted by one pair of first signal lines (that is, the durations of rising edges and the durations of falling edges of the signals transmitted by two first signal lines in one pair of first signal lines are not equal respectively), resulting in non-uniformity of a display image. It should be noted that FIG. 3 only shows the wiring layout in the peripheral area on one side of the display area, for example, the peripheral area on the left side of the display area. The peripheral area on the right side of the display area has the same structure as the peripheral area on the left side of the display area. While, the VSS line passes through the peripheral areas on the left, upper, and right sides of the display area, and thus the first signal lines 110 on the left and right sides of the display area are both affected by uneven parasitic capacitances.

The following table shows the magnitude of the parasitic capacitances between the VSS line and the CK1 as well as between the VSS line and the CB1 in FIG. 3.

| Parasitic capacitance between CK1 and VSS line | 63.034 fF |
|---|---|
| Parasitic capacitance between CB1 and VSS line | 52.562 fF |

It can be seen from the table that the difference between the parasitic capacitance between the CK1 and the VSS line and the parasitic capacitance between the CB1 and the VSS line is at least 10 fF.

Figure 4:
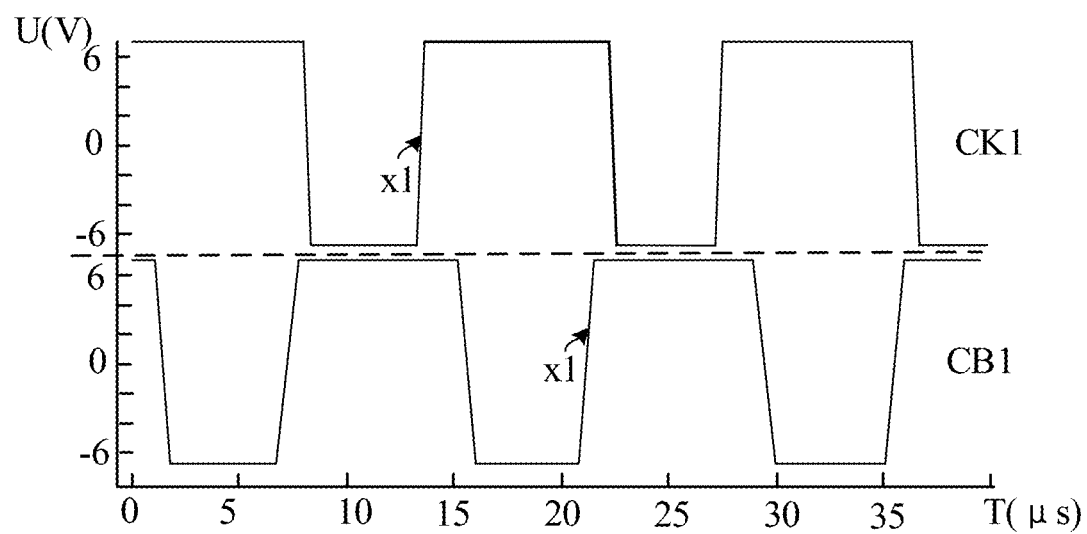
FIG. 4 is a timing diagram of a clock signal in the related art.

FIG. 4 is a timing diagram of a clock signal in the related art. Referring to FIG. 4, since the difference between the parasitic capacitance between the CK1 and the VSS line and the parasitic capacitance between the CB1 and the VSS line is 10 fF, the duration of the rising edge x1 (or a falling edge) of the CK1 is inconsistent with the duration of the rising edge x1 (or a falling edge) of the CB1 (as shown in FIG. 4, the rising edge of the CK1 and the rising edge of the CB1 have different slopes, and similarly, the falling edge of the CK1 and the falling edge of the CB1 also have different slopes). Since the durations of the rising edges (or the falling edges) of the two signals are different, high-level durations and low-level durations of the two signals are different either, resulting in the output mismatch and abnormal display of the display panel. The higher the frequency of the display panel is, the greater the impact of this rising duration and falling duration is. Therefore, the display abnormality is more serious in a high-frequency state.

Figure 5:
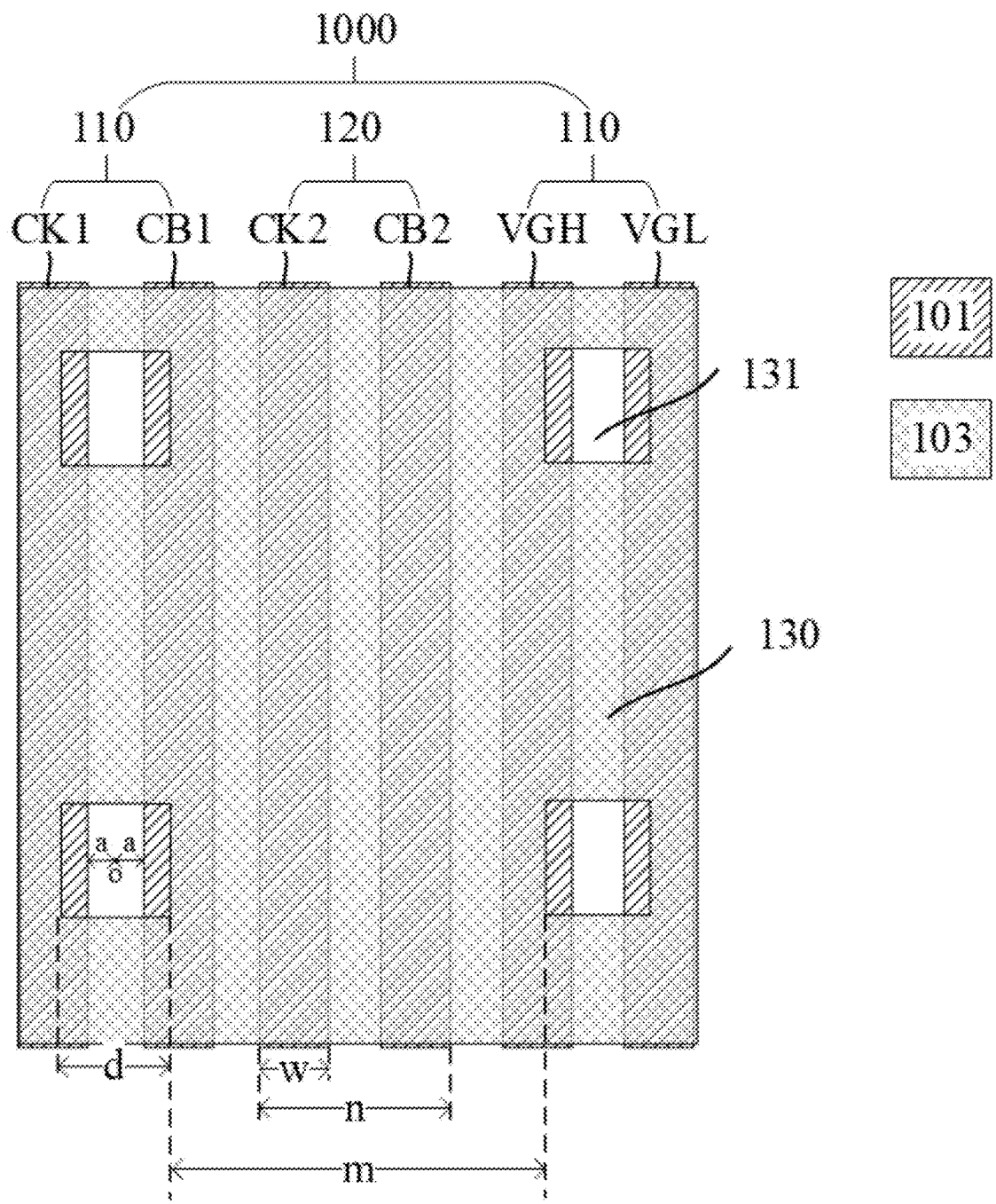
FIG. 5 is a schematic structural diagram of a display substrate provided in some embodiments of the present disclosure.

FIG. 5 is a schematic structural diagram of a display substrate provided in some embodiments of the present disclosure. Referring to FIG. 5, the source/drain layer 101 includes at least a pair of first signal lines 110; and an anode layer 103 includes a common power line 130 which is provided with vent holes 131.

Overlapping areas between two first signal lines 110 in any pair of the first signal lines 110 and a projection pattern of the vent hole are equal, and the overlapping area is greater than 0. The projection pattern of the vent hole is a pattern of an orthographic projection of the vent hole 131 in the common power line 130 onto the source/drain layer 101. "Overlapping" means that overlapping area between the first signal line 110 and the projection pattern of the vent hole is greater than 0.

In the embodiments of the present disclosure, by setting the overlapping areas between the common power line and the two first signal lines in one pair of first signal lines to be equal, parasitic capacitances between the common power line and the two first signal lines in the pair of first signal lines are equal, such that the signals transmitted by the pair of first signal lines match with each other. That is, the durations of the rising edges and the durations of the falling edges of the signals transmitted by the two first signal lines in the pair of first signal lines are equal, respectively, which ensures the uniformity of the display image.

The effects of the solutions provided by the present disclosure are described by taking a pair of first signal lines CK1 and CB1 as an example. The following table shows the magnitude of the parasitic capacitance between the VSS line and the CK1 as well as the magnitude of the parasitic capacitance of between the VSS line and the CB1 in FIG. 5.

| | |
|---|---|
| Parasitic capacitance between CK1 and VSS line | 63.233 fF |
| Parasitic capacitance between CB1 and VSS line | 64.281 fF |

It can be seen from the table that the difference between the parasitic capacitance between the CK1 and the VSS line and the parasitic capacitance between the CB1 and the VSS line is only about 1 fF, which is much smaller than the difference between parasitic capacitances in the related art (in the related art, the difference between the parasitic capacitance between CK1 and the VSS line and the parasitic capacitance between CB1 and the VSS line is at least 10 fF).

Figure 6:
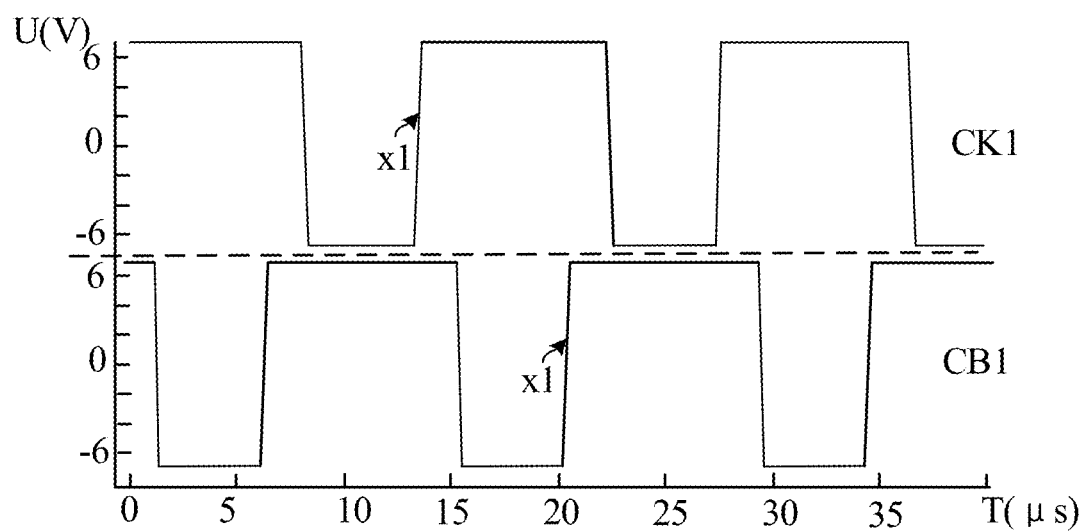
FIG. 6 is a timing diagram of a clock signal provided in some embodiments of the present disclosure.

FIG. 6 is a timing diagram of a clock signal provided in some embodiments of the present disclosure. Referring to FIG. 6, since the difference between the parasitic capacitance between the CK1 and the VSS line and the parasitic capacitance between the CB1 and the VSS line is relatively small, the duration of the rising edge x1 (or the falling edge) of the CK1 is the same as the duration of the rising edge x1 (or the falling edge) of the CB1 (as shown in FIG. 6, the rising edge of the CK1 and the rising edge of the CB1 have the same slope, and similarly, the falling edge of the CK1 and the falling edge of the CB1 also have the same slope). Since the durations of the rising edges (or the falling edges) of the two signals are the same, the high-level durations and low-level durations of the two signals are also the same, respectively, thereby achieving the output match and ensuring the display uniformity of the display panel. Even if in a high-frequency display product, such rising duration and falling duration do not affect the display uniformity, and thus the display effect is ensured.

As shown in FIG. 5, the vent holes 131 in the common power line 130 are arranged in a plurality of columns. In other implementations, the vent holes 131 in the common power line 130 is not distributed in columns. For example, the vent holes 131 are distributed irregularly, as long as it is ensured that overlapping areas between two first signal lines in each pair of first signal lines and the projection pattern of the vent hole are equal.

In the structure shown in FIG. 5, two first signal lines 110 in any pair of first signal lines 110 are both overlapped with the projections of at least one column of vent holes 131 in the projection patterns of the vent holes. That is, in the embodiments of the present disclosure, one pair of first signal lines 110 is only overlapped with the projections of one column of vent holes 131, or overlapped with the projections of a plurality of columns of vent holes 131.

In the embodiments of the present disclosure, the overlapping areas between two first signal lines 110 in one pair of first signal lines 110 and the projection pattern of the vent hole are made equal in a plurality of implementations. As it is only necessary to ensure that the overlapping areas between two first signal lines 110 in each pair of first signal lines and the projection pattern of the vent hole are equal, different pairs of first signal lines are overlapped with the projection pattern of the vent hole in the same implementation or different implementations. Several possible overlapping implementations are introduced below.

In a possible implementation, two first signal lines 110 in one pair of the at least pair of first signal lines 110 are both overlapped with the projections of the same column of vent holes 131 in the projection patterns of the vent holes 131.

In some embodiments, as shown in FIG. 5, the overlapping areas between the two first signal lines 110 and the same vent hole 131 are equal. In other implementations, the overlapping areas between the two first signal lines 110 and the projection of the same vent hole 131 are not equal, as long as the sum of the overlapping areas between one first signal line and the projections of a plurality of vent holes 131 is equal to the sum of the overlapping areas between the other first signal line and the projections of the vent holes 131. For example, the overlap between the leftmost pair of first signal lines and the projection patterns of the vent holes in FIG. 5 is designed as follows: the overlapping area between the projection of a first hole and the first signal line on the left side of the pair of first signal lines is larger than the overlapping area between the projection of the first hole and the first signal line on the right side of the pair of first signal lines; the overlapping area between the projection of a second hole and the first signal line on the left side of the pair of first signal lines is less than the overlapping area between the projection of the second hole and the first signal line on the right side of the pair of first signal lines, but the sum of the overlapping areas between the projections of the two holes and the first signal line on the left side of the pair of first signal lines is equal to the sum of the projections between the two holes and the first signal line on the right side of the pair of first signal lines.

In the implementation shown in FIG. 5, the two first signal lines 110 in one pair of first signal lines 110 are both overlapped with the projections of the same column of vent holes 131 in the projection patterns of the vent holes 131. As long as the overlapping areas between the projection of each vent hole 131 and the two first signal lines 110 are equal, it can be ensured that the overlapping areas between the two first signal lines 110 in one pair of first signal lines 110 and the projection patterns of the vent holes are equal. Since there is a certain distance between the two first signal lines, if one vent hole 131 is overlapped with two first signal lines, the vent hole 131 is designed to be large, to facilitate the patterning of the common power line.

As shown in FIG. 5, CK1 and CB1 are overlapped with the projections of the same column of vent holes 131, and the overlapping areas between CK1 and CB1 and the projection of the same vent hole 131 are equal. VGH and VGL are overlapped with the projections of the same column of vent holes 131, and the overlapping areas between VGH and VGL and the projection of the same vent hole 131 are equal.

In the structure shown in FIG. 5, the shape and area of the vent hole 131 which is overlapped with CK1 and CB1 are the same as the shape and area of the vent hole 131 which is overlapped with VGH and VGL. In other implementations, the shape of the vent hole 131 which is overlapped with CK1 and CB1 is different from the shape of the vent hole 131 which is overlapped with VGH and VGL; or the area of the vent hole 131 which is overlapped with CK1 and CB1 is different from the area of the vent hole 131 which is overlapped with VGH and VGL.

In some embodiments, the shape of each vent hole 131 in one column of vent holes 131 is centrally symmetrical, and the center of the projection of the vent hole 131 is in the middle between two first signal lines 110 of one pair of first signal lines 110.

As shown in FIG. 5, the center O of the projection of the vent hole 131 is in the middle between the two first signal lines 110. That is, the distances from the center O to the side edges of the two first signal lines 110 are equal.

As shown in FIG. 5, the vent hole 131 is square. In other implementations, the vent hole 131 is circular. Square or circular vent holes 131 are convenient to design and manufacture. In other implementations, the vent hole 131 is in other regular or irregular shapes.

In this implementation, the maximum size of the vent hole 131 in the width direction of the first signal line 110 is greater than the width of any of the first signal lines 110. For example, as shown in FIG. 5, the side length d of the vent hole 131 is greater than the width w of the first signal line 110.

In some embodiments, in FIG. 5, respective vent holes 131 in one column of vent holes 131 are the same in shape and area. In other implementations, the shapes of respective vent holes 131 in one column of vent holes 131 is not exactly the same. For example, some vent holes 131 are circular, and some vent holes 131 are square. Alternatively, the areas of respective vent holes 131 in one column of vent holes 131 is not exactly the same. For example, the areas of some vent holes 131 are equal, but the areas of the other vent holes 131 are different from each other.

In a possible implementation, two first signal lines 110 in one pair of at least one pair of first signal lines 110 are both overlapped with the projections of one column of vent holes 131 in the projection patterns of the vent holes 131.

In some embodiments, the vent holes 131 in two columns of vent holes 131 are the same in quantity and area.

In this way, two first signal lines 110 in one pair of first signal lines 110 are overlapped with the projection patterns of two columns of vents holes 131, respectively. As long as the vent holes in the two columns of vent holes 131 are equal in quantity and area, it can be ensured that the overlapping areas between the two first signal lines 110 in one pair of first signal lines 110 and the projection patterns of the vent holes are equal, thereby facilitating the design and manufacture of the vent holes.

In some embodiments, the respective vent holes 131 are the same in shape. The vent holes in the same shape is convenient to design and manufacture, and it is easier to ensure that the areas of the respective vent holes 131 are equal, thereby ensuring that the overlapping areas between the two first signal lines 110 and the projections of two columns of vent holes 131 are equal.

In other implementations, the quantities of the vent holes 131 in two columns of vent holes 131 is not equal, or the areas of at least part of the vent holes 131 are not equal, as long as the sum of the areas of one column of vent holes 131 which are overlapped with one first signal line is equal to the sum of the areas of one column of vent holes 131 which are overlapped with the other first signal line.

Figure 7:
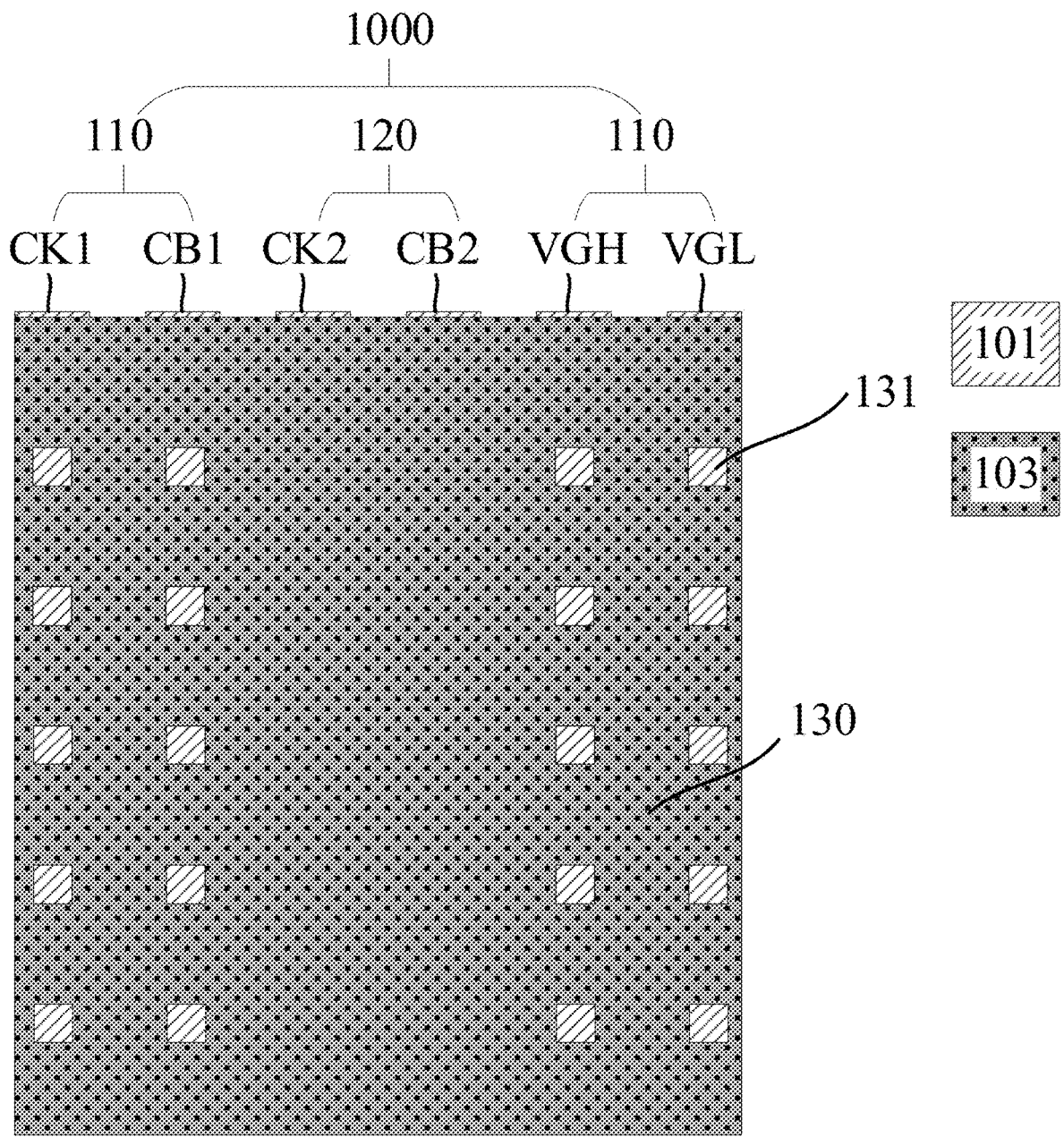
FIG. 7 is a schematic structural diagram of another display substrate provided in some embodiments of the present disclosure.

FIG. 7 is a schematic structural diagram of another display substrate provided in some embodiments of the present disclosure. Referring to FIG. 7, the vent hole 131 is square. In other implementations, the vent hole 131 is circular. Square or circular vent holes 131 are convenient to design and manufacture. In other implementations, the vent hole 131 is in other regular or irregular shapes.

As the distance between two first signal lines is not long, in order to prevent two columns of vent holes 131 from being too close to affect patterning, the size of the vent hole 131 is appropriately reduced, so as to increase the distance between two columns of vent holes 131.

For example, the maximum size of the vent hole 131 in the width direction of the first signal line 110 is less than the width of any one of the first signal lines 110. As shown in FIG. 7, the side length or diameter of the vent hole 131 is less than the width of the first signal line 110.

In addition to the implementation in which one first signal line 110 is overlapped with one column of vent holes in FIG. 7, one first signal line 110 is overlapped with a plurality of columns of vent holes.

As the first signal lines 110 are arranged in the column direction of the display substrate, in order to facilitate design and manufacture, the vent holes 131 in the present disclosure are also arranged in the column direction. In other implementations, the vent holes is arranged in other directions, for example, the arrangement direction and the column direction form an angle, which is not limited in the present disclosure.

Referring to FIG. 5 and FIG. 7 again, the source/drain layer 101 further includes at least one pair of second signal lines 120. Two second signal lines 120 in any pair of second signal lines 120 are staggered (not overlapped with) from the projection patterns of the vent holes. Since the two second signal lines 120 both are not overlapped with the projection patterns of the vent holes, it's also ensured that the parasitic capacitances between the two second signal lines 120 and the common power line are equal in this implementation.

As the vent holes 131 is distributed at intervals, as shown in FIG. 5, one pair of second signal lines 120 is not overlapped with the projection patterns of the vent holes when the spacing m between the vent holes 131 in the line direction is greater than the total width n of one pair of second signal lines.

As shown in FIG. 5 and FIG. 7, neither the second signal line CK2 nor the second signal line CB2 is overlapped with the protections of the vent holes 131. That is, the projections of the vent holes 131 onto the source/drain layer are all outside of CK2 and CB2.

Referring to FIG. 5 and FIG. 7 again, the source/drain layer 101 includes a plurality of pairs of first signal lines 1000. The overlapping areas between any two pairs of signal lines 1000 and the projection patterns of the vent holes are equal or unequal.

That is, in the embodiments of the present disclosure, different pairs of signal lines 1000 are implemented in different ways. The parasitic capacitances between one pair of signal lines and the common power line are balanced, without the need to adopt this implementation for each pair of signal lines, which provides a higher degree of freedom for design.

For example, in FIG. 5, the leftmost pair of first signal lines 110 and the rightmost pair of first signal lines 110 are configured to be both overlapped with the projections of the same column of vent holes 131, respectively, and the overlapping areas between the two pairs of signal lines 1000 and the projection patterns of the vent holes are equal.

The leftmost pair of first signal lines 110 are configured to be overlapped with the projections of the same column of vent holes 131, and the middle pair of second signal lines 120 are configured to be not overlapped with the projections of the vent holes 131 (i.e., the overlapping area is 0), and the overlapping areas between the two pairs of the signal lines 1000 and the projection patterns of the vent holes are not equal.

In FIG. 7, the leftmost pair of first signal lines 110 and the rightmost pair of first signal lines 110 are configured to be overlapped with the projections of one column of vent holes 131, and the overlapping areas between the two pairs of signal lines 1000 and the projection patterns of the vent holes are equal.

The leftmost pair of first signal lines 110 are configured to be overlapped with the projections of one column of vent holes 131, and the middle pair of second signal lines 120 are configured to be not overlapped with the projections of the vent holes 131, and the overlapping areas between the two pairs of signal lines 1000 and the projection patterns of the vent holes are not equal.

In other implementations, each pair of signal lines 1000 is configured to be overlapped with the projections of the vent holes 131 in the same way or in three ways, which is not limited in the present disclosure.

The present disclosure provides a display panel. The display panel includes the display substrate shown in FIG. 5 or FIG. 7.

In the embodiments of the present disclosure, by setting the overlapping areas between the common power line and the two first signal lines in one pair of first signal lines to be equal, the parasitic capacitances between the common power line and the two first signal lines in the pair of first signal lines are equal, such that the signals transmitted by the pair of first signal lines match with each other. That is, the durations of the rising edges and the durations of the falling edges of the signals transmitted by the two first signal lines in the pair of first signal lines are equal, respectively, which ensures the uniformity of the display image.

The present disclosure provides a display device. The display device includes the display panel described above.

During specific implementation, the display device provided in the embodiments of the present disclosure is any product or component with a display function, such as a mobile phone, a tablet computer, a television, a display, a laptop computer, a digital photo frame or a navigator.

In the embodiments of the present disclosure, by setting the overlapping areas between the common power line and the two first signal lines in one pair of first signal lines to be equal, the parasitic capacitances between the common power line and the two first signal lines in the pair of first signal lines are equal, such that the signals transmitted by the pair of first signal lines match with each other. That is, the durations of the rising edges and the durations of the falling edges of the signals transmitted by the two first signal lines in the pair of first signal lines are equal, respectively, which ensures the uniformity of the display image.

Described above are merely optional embodiments of the present disclosure, and are not intended to limit the present disclosure. Within the spirit and principles of the present disclosure, any modifications, equivalent substitutions, improvements, and the like are within the protection scope of the present disclosure.

The invention claimed is:

1. A display substrate, providing with a display area and a peripheral area around the display area, and comprising: a source/drain layer, a planarization layer and an anode layer which are laminated in sequence, wherein
in the peripheral area, the source/drain layer comprises at least one pair of first signal lines comprising a signal line of a gate circuit and the anode layer comprises a common power line provided with vent holes; and
overlapping areas between two first signal lines in any pair of the first signal lines and a projection pattern of the vent hole are equal, the projection pattern of the vent hole being a pattern of an orthographic projection of the vent hole in the common power line onto the source/drain layer.

2. The display substrate according to claim 1, wherein the vent holes in the common power line are arranged in a plurality of columns; and
two first signal lines in any pair of the first signal lines are overlapped with projections of at least one column of vent holes in the projection patterns of the vent holes.

3. The display substrate according to claim 2, wherein two first signal lines in one pair of the first signal lines are both overlapped with the projections of a same column of vent holes in the projection patterns of the vent holes.

4. The display substrate according to claim 3, wherein the overlapping areas between the two first signal lines and a same vent hole are equal.

5. The display substrate according to claim 4, wherein a shape of each vent hole in the one column of vent holes is centrally symmetrical, and a center of the projection of the vent hole is in the middle between the two first signal lines.

6. The display substrate according to claim 5, wherein distances from the center of the projection of the vent hole to side edges of the two first signal lines in the one pair of the first signal lines are equal.

7. The display substrate according to claim 3, wherein a maximum size of the vent hole in a width direction of the first signal line is greater than a width of any one of the first signal line.

8. The display substrate according to claim 2, wherein two first signal lines in one pair of the first signal lines are both overlapped with projections of one column of vent holes in the projection patterns of the vent holes.

9. The display substrate according to claim 8, wherein two columns of vent holes whose projections are overlapped with a same pair of first signal lines are the same in quantity and area.

10. The display substrate according to claim 1, wherein the source/drain layer further comprises at least one pair of second signal lines; and two second signal lines in any pair of the second signal lines are staggered from the projection patterns of the vent holes.

11. The display substrate according to claim 1, wherein the vent hole is square or circular.

12. The display substrate according to claim 1, wherein the source/drain layer comprises a plurality of pairs of first signal lines; and overlapping areas between any two pairs of first signal lines and the projection patterns of the vent holes are equal or unequal.

13. The display substrate according to claim 1, wherein one pair of the at least one pair of the first signal lines comprises a high-level clock signal line and a low-level clock signal line.

14. The display substrate according to claim 1, wherein one pair of the at least one pair of the first signal lines comprises a high-level gate line and a low-level gate line.

15. A display panel, comprising a display substrate, wherein the display substrate is provided with a display area and a peripheral area around the display area, and comprises: a source/drain layer, a planarization layer and an anode layer which are laminated in sequence, wherein
in the peripheral area, the source/drain layer comprises at least one pair of first signal lines comprising a signal line of a gate circuit and the anode layer comprises a common power line provided with vent holes; and
overlapping areas between two first signal lines in any pair of the first signal lines and a projection pattern of the vent hole are equal, the projection pattern of the vent hole being a pattern of an orthographic projection of the vent hole in the common power line onto the source/drain layer.

16. The display panel according to claim 15, wherein the vent holes in the common power line are arranged in a plurality of columns; and two first signal lines in any pair of the first signal lines are overlapped with projections of at least one column of vent holes in the projection patterns of the vent holes.

17. The display panel according to claim 15, wherein the source/drain layer further comprises at least one pair of second signal lines; and two second signal lines in any pair of the second signal lines are staggered from the projection patterns of the vent holes.

18. The display panel according to claim 15, wherein the vent hole is square or circular.

19. The display panel according to claim 15, wherein the source/drain layer comprises a plurality of pairs of first signal lines; and overlapping areas between any two pairs of first signal lines and the projection patterns of the vent holes are equal or unequal.

20. A display device, comprising a display panel comprising a display substrate, wherein the display substrate is provided with a display area and a peripheral area around the display area, and comprises: a source/drain layer, a planarization layer and an anode layer which are laminated in sequence, wherein in the peripheral area, the source/drain layer comprises at least one pair of first signal lines comprising a signal line of a gate circuit and the anode layer comprises a common power line provided with vent holes; and overlapping areas between two first signal lines in any pair of the first signal lines and a projection pattern of the vent hole are equal, the projection pattern of the vent hole being a pattern of an orthographic projection of the vent hole in the common power line onto the source/drain layer.

* * * * *